United States Patent [19]

Sicard et al.

[11] Patent Number: 4,928,053
[45] Date of Patent: May 22, 1990

[54] CONTROL CIRCUIT FOR AN INDUCTIVE LOAD

[75] Inventors: Thierry M. A. Sicard, Fenouillet; Michel J. Suquet, Villeneuve-Tolosane, both of France

[73] Assignee: Siemens Aktiengesellschaft, Munich, Fed. Rep. of Germany

[21] Appl. No.: 333,367

[22] Filed: Apr. 4, 1989

[30] Foreign Application Priority Data

Apr. 14, 1988 [FR] France ............................ 88 04938

[51] Int. Cl.$^5$ .............................................. G05F 1/56
[52] U.S. Cl. .................................. 323/284; 323/289; 307/270; 307/571
[58] Field of Search ............... 323/284, 282, 283, 289; 307/270, 300, 571, 584, 585

[56] References Cited

U.S. PATENT DOCUMENTS

| 4,500,801 | 2/1985 | Janutka | 307/570 |
| 4,575,642 | 3/1986 | Hochreutiner et al. | 307/270 |
| 4,603,269 | 7/1986 | Hochstein | 307/571 |
| 4,691,129 | 9/1987 | Einzinger et al. | 307/270 |
| 4,704,549 | 11/1987 | Sanwo et al. | 307/571 |

FOREIGN PATENT DOCUMENTS 59-19432 1/1984 Japan.
59-97223 6/1984 Japan.
WO86/02127 4/1986 World Int. Prop. O..

OTHER PUBLICATIONS

Christiansen et al., "Wideband Driver for Power MOSFETs", International Journal of Electronics, vol. 56, No. 3, Mar. 1984, pp. 429-431, Basingstroke, Hampshire, GB.

Primary Examiner—Peter S. Wong
Attorney, Agent, or Firm—Russel C. Wells; George L. Boller

[57] ABSTRACT

The circuit according to the invention controls the supply to an inductive load by a power transistor of the N-channel MOS type, placed on the side of the positive terminal of a supply source delivering a voltage +Vbat. The conduction of the transistor is maintained by means of a gate voltage Vs > +Vbat supplied by a voltage multiplier. On cutting off this voltage, there is blocking of the transistor and discharge of the load, which rapidly develops a high negative voltage. An interconnecting transistor than prevents the return to conduction of the power transistor while, according to the invention, a transistor of the P-channel MOS type isolates the gate of the interconnecting transistor to authorize the application to said gate of the negative voltage developed by the inductive load. The invention has application to the control of actuators for the automobile industry.

9 Claims, 1 Drawing Sheet

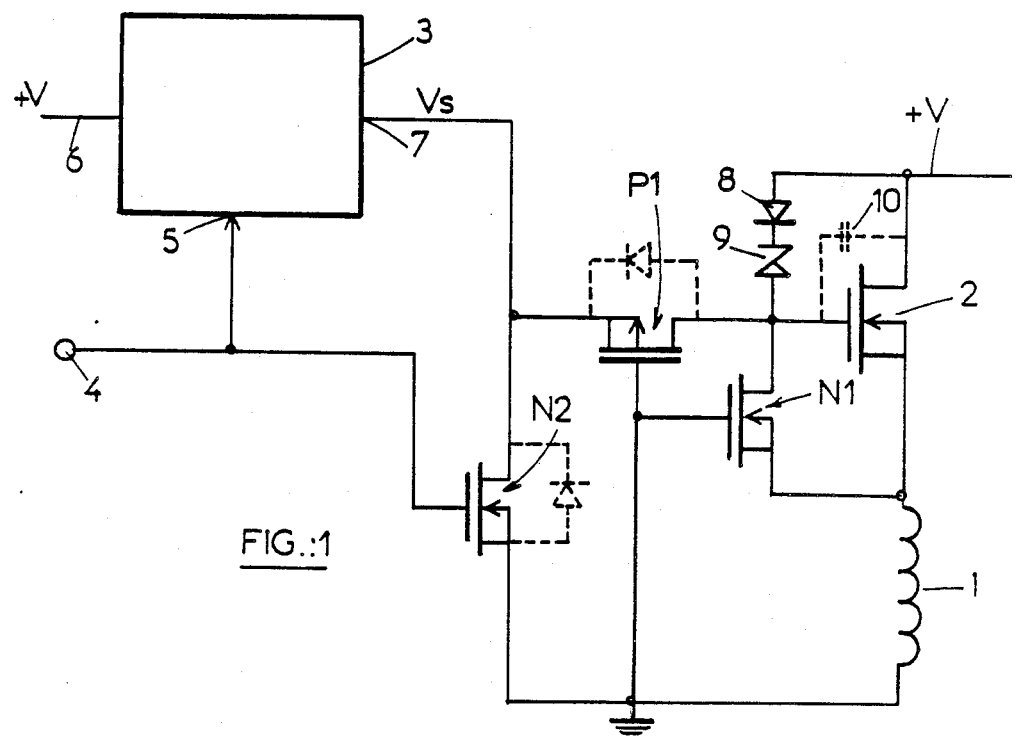
FIG.:1
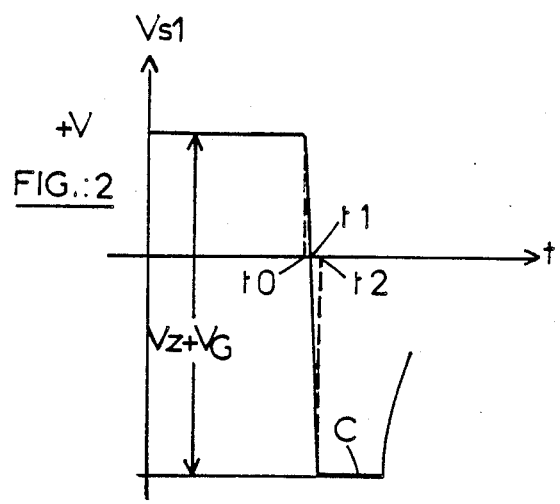
FIG.:2

CONTROL CIRCUIT FOR AN INDUCTIVE LOAD

The present invention relates to a control circuit for an inductive load and, more particularly, to such a circuit protected against the negative excess voltages which appear at the terminals of the load, on cutting off the supply to this load.

In automobile electronics, functions such as the ignition, the control of the injection time, the modulation of the pressure within the braking circuits make use of inductive loads, the supply of which must be controlled by power transistors. As examples of such inductive loads, it is possible to mention the coil of an injector or that of a solenoid valve which modulates a pressure of a braking liquid in an antilock braking system of an automobile vehicle. It is furthermore possible to mention the coil of a primary inductive ignition circuit.

The power transistor used to control the supply to such a load is commonly constructed using MOS technology, the drain-source circuit of this transistor being placed in series with the load, between the latter and the positive terminal of the supply source, an automobile vehicle battery in the present case.

It is known that, when there is a sudden cutoff of the supply to an inductive load, a high negative excess voltage appears immediately at the terminals of the latter. In the case of the control of the supply to such a load, it is appropriate to provide means for preventing this high negative excess voltage from then disturbing the operation of the circuit, for example by restoring the blocked transistor to conduction.

A known solution to this problem consists, in the case of the control of an inductive load by an N-channel MOS power transistor placed on the "supply" side of the load, in connecting the drain-source circuit of an MOS transistor forming an interconnection between the gate and the source of the power transistor, in such a manner that the placing in conduction of the interconnecting transistor establishes a gate-source voltage for the power transistor which is suitable for maintaining the blocking thereof.

However, this measure is effective only if the gate of the power transistor is moreover isolated from the remainder of the control circuit. It is possible to think of using, to this end, an insulated resistor made of polysilicon. Unfortunately, it is not known to construct such resistors exhibiting a precise value, and the result of this is that the negative voltage which the circuit can accept is then also imprecise or of poor reproducibility.

The object of the present invention is therefore to provide a control circuit for an inductive load having an N-channel MOS-type power transistor placed in series with the load on the positive side of an electrical supply source, comprising an interconnecting transistor between its gate and its source, this circuit comprising means ensuring, in a precise and reproducible manner, the isolation of the gate of the power transistor when negative voltages are applied to it via the interconnecting transistor, in the course of a discharge of the inductive load.

This object of the invention, as well as others which will appear hereinbelow, are achieved with a control circuit for an inductive load, comprising an N-channel MOS power transistor, the drain of which is connected to the positive terminal of a direct current electrical supply source supplying a voltage +Vbat while the inductive load is connected the source of this transistor and ground, the drain-source circuit of an N-channel MOS interconnecting transistor being connected between the gate and the source of the power transistor, the conduction threshold of the transistor being below that of the power transistor, which control circuit comprises a P-channel MOS isolating transistor, the drain and the gate of which are connected respectively to the gate of the power transistor and to the ground of the circuit, the source of the isolating transistor being selectively brought to a voltage less than or greater than +Vbat, to block or unblock the conduction of the power transistor, respectively.

The circuit comprises a voltage multiplier supplied by the direct current supply source to supply an output voltage Vs applied to the source of the isolating transistor, the voltage multiplier being controlled to supply selectively a voltage Vs less than or greater than the voltage +Vbat of the supply source, in such a manner as to control the blocking or the unblocking of the power transistor, respectively.

The circuit also comprises a third N-channel MOS transistor, the drain of which is connected to the source of the P-channel MOS transistor and the source of which is connected to the ground of the circuit, the gate of this transistor being connected to a source of a control signal for blocking/unblocking the MOS power transistor.

The control signal source is connected to a control input of the voltage multiplier, in such a manner that the control signal causes selectively either the production by the multiplier of a voltage Vs greater than the voltage +Vbat and the blocking of the third N-channel MOS transistor or the production by the multiplier of a voltage Vs less than the voltage +Vbat and the unblocking of the third N-channel MOS transistor.

According to an advantageous embodiment of the invention, the MOS power transistor is integrated on the same chip as the remainder of the control circuit, which takes the form of a "smart" power circuit.

In the accompanying drawing, which is given purely by way of example:

FIG. 1 is a diagram of the control circuit for an inductive load, according to the invention, and FIG. 2 is a graph of the form of the development of the voltage at the terminals of the inductive load, in the course of the blocking of the power transistor controlling the supply to this load.

Reference is made to FIG. 1 of the drawing, in which the circuit represented serves to control the supply to an inductive load 1. As has been seen herein-above, such inductive loads are found in the fuel injectors for internal combustion engines, in the solenoid valves which modulate the pressure of a braking liquid of an antilock braking system of an automobile vehicle, for example. The excitation of such actuators is triggered by the passage of a current in a coil constituting the inductive load, an electronic switch such as a power transistor 2 being placed in series with the inductive load 1 to control the passage of the current.

The power transistor 2 employed in the circuit of the invention is an N-channel MOS transistor (for example of the DMOS type), the substrate of which is connected conventionally to the source. The drain of the transistor 2 is connected to the positive terminal of an electrical supply source. In the "automobile" applications of the invention, this source is formed by the battery of a vehicle, which delivers a voltage +Vbat, for example of 12 volts. The source of the transistor 2 is connected to the load 1. The transistor 2 is thus connected to the "hot" point of the circuit, on the side of the positive terminal of the battery according to a configuration which is commonly adopted in automobile electronics.

The circuit according to the invention also comprises a transistor N1 of the N-channel MOS type, the drain and the source of which are connected respectively to the gate and to the source of the transistor 2. The gate of the transistor N1 is connected to the ground of the circuit. The transistor N1 controls an interconnection of the gate and of the source of the transistor 2, as will be seen hereinbelow.

According to an essential feature of the circuit according to the invention, the drain of a transistor P1 of the P-channel MOS type is connected to the gate of the transistor 2, while the source is connected to the point common to the output of a voltage multiplier 3 and to the drain of a third transistor N2 of the N-channel MOS type, the source of which is at ground. The substrates of all these transistors are connected to the source, in a conventional manner.

The signal for controlling the switching of the power transistor 2 is a logic signal having two levels. It is applied to an input pin 4 of the circuit, which pin is connected, on the one hand, to the control input 5 of the voltage multiplier and, on the other hand, to the gate of the transistor N2.

The voltage multiplier 3 is supplied on one input 6 by the battery to deliver at its output 7 a voltage Vs of value greater than +Vbat under the control of the signal received at its input 5. The voltage Vs serves to switch the transistor 2 into its conductive condition, as will be seen hereinbelow, in order thus to ensure the supply to the inductive load 1.

The circuit is completed by a diode 8, the anode of which is connected to a line brought to the voltage +Vbat and the cathode of which is connected to that of a Zener diode 9, the anode of this Zener diode being itself connected to the gate of the transistor 2.

According to the present invention, the breakdown voltage Vz of the Zener diode 9 is greater than +Vbat. Thus, as will be seen hereinbelow, the diode 9 permits the limiting of the negative voltage which appears at the terminals of the load 1, on cutting off the current in this load. The diode 8, on its part, isolates the gate of the transistor 2 from the line +Vbat when this gate is brought to the output voltage Vs of the multiplier 3, this voltage Vs being greater than +Vbat, as has been indicated hereinabove.

An explanation is now given of the operation of the circuit according to the invention, which permits the maintenance of the blocking of the MOS power transistor when a negative voltage appears at the terminals of the inductive load controlled by this transistor.

When the control signal applied to the pin 4 of the circuit is at its "low" level, the voltage multiplier is active and delivers a voltage Vs greater than +Vbat. This same control signal, applied to the gate of the transistor N2 of the N-channel MOS type, blocks this transistor. The gate-source voltage of the transistor P1 of the P-channel MOS type is then negative; this makes this transistor conducting. The voltage Vs is then applied to the gate of the power transistor 2, which conducts. The source of the transistor 2 is then at a potential close to +Vbat, apart from the drain-source voltage drop of the transistor 2. The gate-source voltage of the transistor 2 is then in the order of (Vs-Vbat). To ensure a free switching of the transistor 2, the voltage multiplier is designed to supply a voltage Vs which is greater than +Vbat by approximately ten volts. Under these conditions, the inductive load is supplied by the current supplied by the line +Vbat. It will be noted, in FIG. 1, that there is a capacitor 10 represented in broken lines, which corresponds to the gate-drain capacitance of the transistor 2, this capacitor then being charged to the voltage Vs-Vbat.

If, at the instant to (see FIG. 2), the control signal applied to the pin 4 passes to the "high" level, the voltage multiplier is made inactive and its output 7 passes to a zero voltage level; this blocks the transistor 2, while the transistor N2 is unblocked. There is then observed, first of all, a discharge of the capacitor 10 through the intrinsic diode of the transistor P1 (shown in broken lines in FIG. 1) and the transistor N2. This discharge is continued until the instant t1 (FIG. 2) when the voltage Vsl at the terminals of the inductive load 1 becomes negative, as following the blocking of the transistor 2. A conspicuous feature is the tightness of the part of the curve of FIG. 2 which follows the instant to, this tightness being characteristic of the discharge of an inductive load.

As from the instant t1, the source voltage of the transistor 2 being negative while its gate voltage is zero, the conditions for a return to conduction of the transistor 2 are fulfilled. Such a return to conduction would prematurely interrupt the discharge of the inductive load. In order to avoid this, according to the invention, the gate of the transistor 2 is isolated by blocking the transistor P1, while the return to conduction of the transistor N1 establishes a zero gate-source voltage on the transistor 2, which prevents its return to conduction. To do this, the transistor N1 is chosen in such a manner as to exhibit a threshold voltage below that of the power transistor 2. In the absence of isolation of the gate of the transistor 2 by the blocking of the transistor P1, it would, in fact, be observed that it was impossible to maintain the gate at a negative voltage, since there would then be discharge through the intrinsic diode (represented in broken lines) of the transistor N2.

The transistor P1 being blocked and the transistor N1 conducting, the capacitor 10 finishes discharging through the drain-source circuit of the transistor N1 after the instant t1. The negative voltage which has appeared at the terminals of the load 1 continuing to grow, it is necessary to limit this growth to a value which can be accepted by the circuit. In the circuit according to the invention, this limitation is obtained by means of the Zener diode 9 which exhibits a breakdown voltage Vz which is greater, in absolute value, than +Vbat. As soon as the voltage between the gate of the transistor 2 and the line at +Vbat exceeds the voltage Vz (the instant t2, FIG. 2), the diode 9 becomes conducting. A current is then forced in the equivalent resistance Rdson of the drain-source circuit of the transistor N1. A gate-source voltage Vgson is established on the transistor 2 (part C of the curve of FIG. 2), which reestablishes the conduction of the power transistor 2. This return to conduction then causes a progressive abatement of the current. When the current is zero, the voltage decreases progressively on account of the Foucault currents when the inductive load is associated with a magnetic core, as shown by the form of the curve of FIG. 2. If the inductive load is pure (a self-inductor "in air"), the voltage drop is sudden.

The circuit according to the invention may thus accept the high negative voltages which appear in the course of a rapid discharge of the energy accumulated in the inductive load which it controls. The isolation obtained by means of the transistor Pl of the P-channel MOS type is faultless and does not introduce the defects of reproducibility which are observed on the circuits of the prior art.

The invention is, of course, not limited, to the embodiment described and represented, which has been given purely by way of example. In particular, the protection according to the invention of a control circuit for an inductive load might be applied to the control of actuators or other components used other than in automobile vehicles. The invention extends to the control of any inductive load, such as, for example, a rotor or stator winding of an electric motor.

We claim:

1. A control circuit for an inductive load, comprising an N-channel MOS power transistor, the drain of which is connected to the positive terminal of a direct current electrical supply source supplying a voltage $+Vbat$ while the inductive load is connected between the source of this transistor and ground, the drain-source circuit of an N-channel MOS interconnecting transistor (N1) being connected between the gate and the source of the power transistor, said interconnecting transistor having a conduction threshold below that of the power transistor, said control circuit comprising a P-channel MOS isolating transistor (P1), the drain and the gate of which are connected respectively to the gate of the power transistor and to the ground of the circuit, the source of the isolating transistor (P1) being selectively brought to a voltage less than or greater than $+Vbat$, to block or to unblock the conduction of the power transistor, respectively.

2. The circuit as claimed in claim 1, which comprises a voltage multiplier supplied by the direct current supply source to supply selectively an output voltage Vs applied to the source of the isolating transistor (P1), the voltage multiplier being controlled to supply selectively a voltage Vs less than or greater than the voltage $+Vbat$ of the supply source, in such a manner as to control the blocking or the unblocking of the power transistor, respectively.

3. The circuit as claimed in claim 2, which comprises a third N-channel MOS transistor (N2), the drain of which is connected to the source of the P-channel MOS isolating transistor (P1) and the source of which is connected to the ground of the circuit, the gate of this third N-channel transistor being connected to a source of a control signal for selectively blocking and unblocking the MOS power transistor.

4. The circuit as claimed in claim 3, wherein the control signal source is connected to a control input (5) of the voltage multiplier, in such a manner that the control signal causes selectively either the production by the multiplier of an output voltage Vs greater than the voltage $+Vbat$ and the blocking of the third N-channel MOS transistor (N2) or the production by the multiplier of an output voltage less than the voltage $+Vbat$ and the unblocking of the third N-channel MOS transistor (N2).

5. The circuit as claimed in claim 4, wherein the control signal is a logic signal, the output of the voltage multiplier being at the voltage Vs which is greater than or less than $+Vbat$, depending upon whether the logic signal is "low" or "high".

6. The circuit as claimed in claim 5, wherein the gate of the MOS interconnecting transistor (N1) is connected to ground.

7. The circuit as claimed in claim 6, which comprises a Zener diode (9) connected in reverse between a positive terminal of the supply source and the junction of the drain of the isolating transistor (P1) with the gate of the power transistor, this diode exhibiting a breakdown voltage Vz which is greater than the voltage $+Vbat$ to limit the amplitude of negative development of the voltage at the terminals of the load, to the blocking of the power transistor.

8. The circuit as claimed in claim 7, wherein an isolating diode (8) is connected between the source $+Vbat$ and the Zener diode, the anode of the diode being connected to the source $+Vbat$.

9. The circuit as claimed in claim 1, which comprises a third N-channel MOS transistor (N2), the drain of which is connected to the source of the P-channel MOS isolating transistor (P1) and the source of which is connected to the ground of the circuit, the gate of this third N-channel transistor being connected to a source of a control signal for selectively blocking and unblocking the MOS power transistor.

* * * * *